US006477059B1

(12) United States Patent
Ono et al.

(10) Patent No.: US 6,477,059 B1
(45) Date of Patent: Nov. 5, 2002

(54) BOARD CONNECTION STRUCTURE, ELECTRONIC DEVICE WITH BOARD CONNECTION STRUCTURE AND CONNECTOR USED THEREIN

(75) Inventors: Akihisa Ono; Kazuo Miura, both of Kanagawa (JP)

(73) Assignee: Sony Computer Entertainment, INC, Tokyo (JP)

(*) Notice: Subject to any disclaimer, the term of this patent is extended or adjusted under 35 U.S.C. 154(b) by 50 days.

(21) Appl. No.: 09/643,565

(22) Filed: Aug. 22, 2000

(51) Int. Cl.$^7$ ............................................... H01R 12/16
(52) U.S. Cl. ..................... 361/785; 361/736; 361/792; 361/803; 361/790; 361/735; 361/749; 439/67; 439/65; 439/493
(58) Field of Search ............................... 361/748, 749, 361/784, 785, 803, 789, 792, 736, 790, 735, 707, 752; 439/67, 493, 65

(56) References Cited

U.S. PATENT DOCUMENTS

| | | | | |
|---|---|---|---|---|
| 4,109,298 A | * | 8/1978 | Hanni et al. | 361/412 |
| 4,179,724 A | * | 12/1979 | Bonhomme | 361/391 |
| 4,631,637 A | * | 12/1986 | Romania et al. | 361/413 |
| 5,186,638 A | * | 2/1993 | Pusch | 439/140 |
| 5,266,912 A | | 11/1993 | Kledzik | |
| 5,335,146 A | * | 8/1994 | Stucke | 361/785 |
| 5,469,335 A | * | 11/1995 | Kluth et al. | 174/35 R |
| 5,507,651 A | * | 4/1996 | Tanaka et al. | 439/67 |

FOREIGN PATENT DOCUMENTS

| | | |
|---|---|---|
| DE | 90 12 859 | 3/1991 |
| DE | 90 13 456 | 2/1992 |

* cited by examiner

Primary Examiner—David Martin
Assistant Examiner—Thanh Y. Tran
(74) Attorney, Agent, or Firm—Katten Muchin Zavis Rosenman

(57) ABSTRACT

In an electronic device, a board connection structure of the present invention is provided, that electrically connects conductive parts of multiple circuit boards arranged in layers. The board connection structure reduces the positional displacement of the two circuit boards without considering the positioning precision of connectors provided on each circuit board. The board connection structure of the present invention is a board connection structure 1 which connects electrically conductive parts (13, 23) of two circuit boards (11, 21) arranged in layers. The board connection structure has a pair of connectors (31, 41) which have electrical continuity with the conductive parts (13, 23) of the two circuit boards (11, 21) arranged facing each other, and a flexible wiring board 51 which is electrically connected with each of the pair of connectors (31, 41) and ensures electrical continuity between the connectors (31, 41). The connectors (31, 41) are of non-ZIF type and ensure electrical connection and physical anchoring by inserting the flexible wiring board 51 into insertion holes formed in the connectors.

11 Claims, 3 Drawing Sheets

BOARD CONNECTION STRUCTURE, ELECTRONIC DEVICE WITH BOARD CONNECTION STRUCTURE AND CONNECTOR USED THEREIN

FIELD OF THE INVENTION

The present invention relates to a board connection structure that mutually connects multiple circuit boards that are arranged in layers, an electronic device equipped with the board connection structure, and a connector used in the board connection structure.

BACKGROUND OF THE INVENTION

Multiple circuit boards on which various circuit elements are mounted, are arranged in layers in audiovisual equipment, computers, and other electronic devices. Arranging multiple circuit boards in this laminated way improves efficiency with which components are packed inside such electronic devices and makes them smaller.

In making electrical connections between the conductive parts on circuit boards where multiple circuit boards are arranged in layers, so-called board-to-board connectors have been employed, in which a plug is provided on one circuit board, a receptacle is provided on another circuit board, and the plug and receptacle are joined by a direct mechanical connection (Japanese patent application Laid-Open No. 59-148289, 1984).

However, in such conventional board connection structure, the relative position of two circuit boards is uniquely determined by the mechanical connection between the plug and the receptacle because of rigidity of the boards themselves. Thus if positional displacement of two circuit boards is set smaller in order to improve their packability inside the housing of an electronic device, the problem arises that one must attach the plug and receptacle precisely positioned on each circuit board. In particular, as electronic devices are given more sophisticated functions to perform and circuit boards are made larger, the precision with which plugs and receptacles are attached to circuit boards greatly affects the positional displacement of the circuit boards they connect.

Since the plug and the receptacle are fitted together mechanically by making the connection with such a board-to-board connector, it is difficult to adjust the distance between laminated circuit boards to fit the dimensions of the housing of the electronic device, which puts limits on how small the electronic device may be made. A further problem is that in connecting together the circuit boards with such board-to-board connector, the plug and the receptacle must be fitted together while checking them from the side, which makes the assembly work more complicated during manufacturing.

SUMMARY OF THE INVENTION

It is an object of this invention to provide, in a board connection structure by which electrical connection is made between the conductive parts of multiple circuit boards arranged in layers, a board connection structure that reduces a positional displacement between the two circuit boards without considering the positioning precision of the connectors provided on each circuit board, to provide an electronic device that can be made smaller by reducing the positional displacement of circuit boards, and to provide a connector that makes it easy to connect multiple circuit boards.

In order to achieve the above objects, a board connection structure of the present invention is a board connection structure in which conductive parts of at least two circuit boards arranged in layers are electrically connected. The board connection structure includes a pair of connectors having electrical continuity with the conductive parts of the circuit boards arranged facing each other, and a flexible wiring board that is electrically connected to each of the connectors of the pair and ensures electrical continuity between said pair of connectors. The connector is arranged such that inserting said flexible wiring board therebetween ensures an electrical connection and a physical anchoring in the structure.

Here, one can use as a connector a so-called non-ZIF (non-zero insert force) type. For example, one can use a connector that has a non-conductive case in which an opening is formed into which a flexible wiring board is inserted, and a metal contact part which is provided inside the case, is formed on the flexible wiring board has a claw part for resisting the pullout force of the inserted flexible wiring board.

As the flexible wiring board one can use the board on which FFC (flat flex cable) or other electrodes are formed on the front surface and/or back surface of the flexible board made of PET (polyethylene terephthalate), etc.

With the present invention, a pair of connectors are connected via the flexible wiring board, making it possible to absorb the shift of mounting position of connectors on a circuit board and to house electronic devices in a housing with reduced positional displacement of the circuit boards.

Connection via the flexible wiring board makes it possible to adjust the distance between the two circuit boards, thereby making it possible to reduce the size of electronic devices using the board connection structure of this invention.

Since the physical anchoring between the two circuit boards is ensured just by inserting the flexible wiring board into the connector, the two circuit boards can be connected simply, just by inserting a flexible wiring board into the connector, which simplifies the assembly work of connecting the circuit boards together.

Also, because the connector has the claw part that resists the pulling-out force of the flexible wiring board, a board connection structure can be provided, in which insertion is easy, and it is difficult to break the connection between the connector and the flexible wiring board.

In addition, because the flexible wiring board is provided with electrodes formed on the front surface and/or back surface of a flexible board material, it is easy to manufacture flexible wiring boards using conventional wiring pattern printing, etc.

It is desirable that at least one of the aforesaid pair of connectors be a through-type connector that the flexible wiring board pierces, and that on the circuit board surface on which this through-type connector is provided, there would be formed holes into which the flexible wiring board can be inserted from the surface opposite the mounting surface of the through-type connector.

The board connection structure of the present invention can be made by a procedure such as the following:

(1) Attach a flexible wiring board to the connector mounted on the circuit board arranged at the bottom of the multiple laminated wiring boards.

(2) Insert the end of the flexible wiring board into the through-type connector provided on the laminating circuit board, pull the end of the flexible wiring board out through the pullout opening of the through-type connector and the hole in the circuit board, adjust the distance between the two circuit boards, and arrange the circuit board in optimum position. If laminating three or more circuit boards, laminate a circuit board on which through-type connectors are mounted and on which holes are formed into the flexible wiring board can be inserted, and repeat the operation of step (2).

That is, by the board connection structure of this invention, adopting a composition such as proposed in this application, circuit boards can be connected without checking from the side, which greatly reduces the assembly work during manufacturing.

Also, the electronic device of this invention is characterized in that it can have any of the aforesaid board connection structures.

The electronic device could be a notebook-type personal computer, an audiovisual device, a computer game machine, etc.

By adopting the board connection structure of the present invention, the positional displacement of laminated circuit boards can be reduced, which improves the packability of the electronic device into a housing and makes it easy to reduce the size of the electronic device. And because the work of connecting boards can be done without checking from the side, the work of assembling the electronic device can be greatly reduced.

Also, the connector of the present invention has an insertion opening into which the flexible wiring board is inserted and a pullout opening through which the flexible wiring board inserted through this insertion opening, is pulled out. It can go through the flexible wiring board.

The connector of this invention preferably ensures electrical connection and physical anchoring just by inserting the flexible wiring board.

With such a connector, by forming insertion holes for flexible wiring boards in multiple circuit boards arranged in layers and allowing the flexible wiring board to go through the connector, multiple circuit boards can be electrically connected to each other, which can greatly reduce the work of connecting the circuit boards.

A sloping surface may be formed around the insertion opening of the connector to guide in the flexible wiring board.

That is, by forming such sloping surface, the flexible wiring board is guided quickly into the inside of the connector, which makes the work of connecting the circuit boards even easier.

DETAILED DESCRIPTION OF THE PREFERRED EMBODIMENT

An embodiment of the present invention will hereinafter be described with reference to the accompanying drawings.

Figure 1:
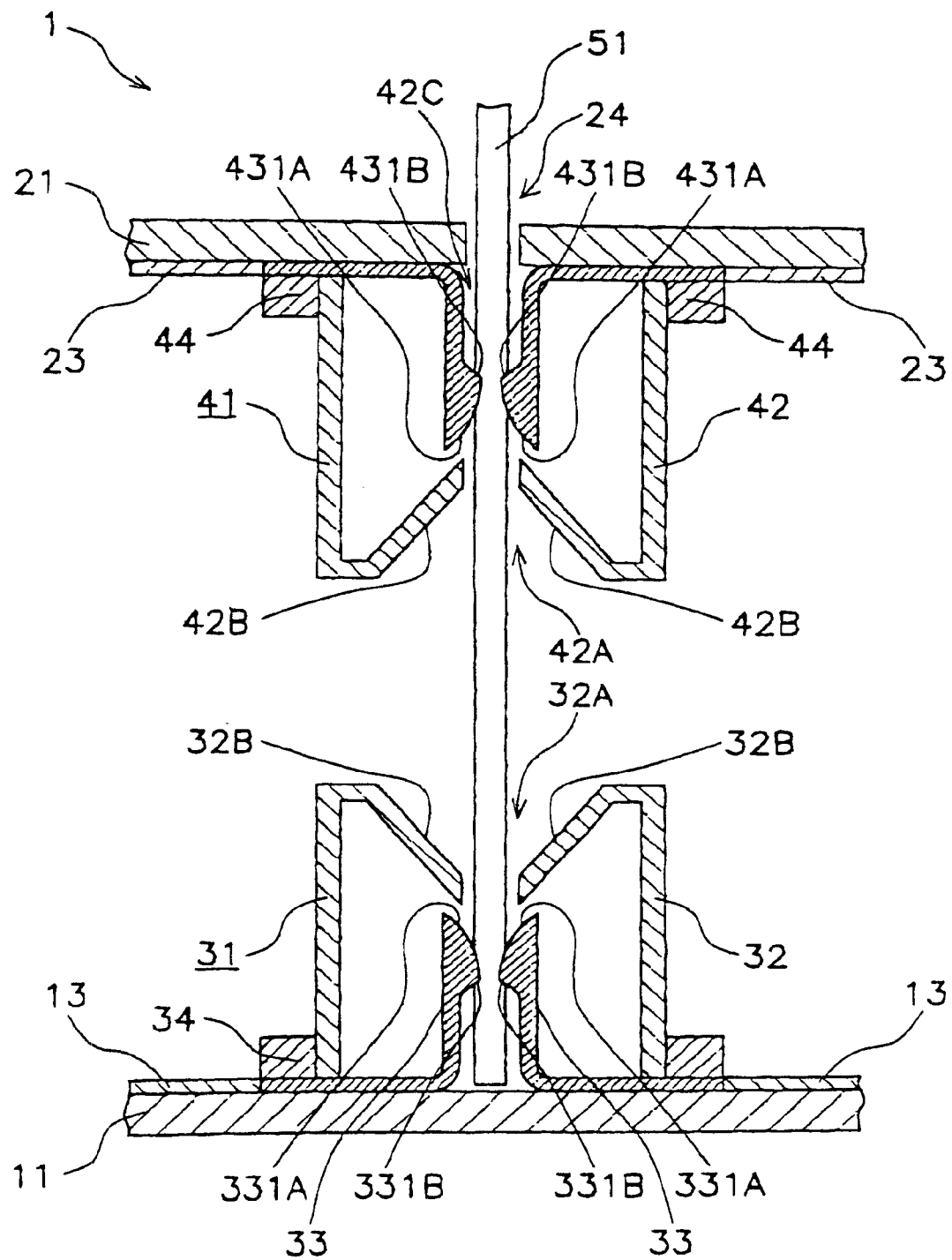
FIG. 1 is a cross-sectional view showing the board connection structure of an embodiment of the present invention.

FIG. 1 shows a board connection structure of an embodiment of the invention. The board connection structure 1 has two circuit boards 11, 21 arranged in layers, a pair of connectors 31, 41 mounted on surfaces of these two circuit boards 11, 21 that face each other and a flexible wiring board 51, which is electrically connected with the pair of connectors 31, 41.

Circuit board 11 is a printed wiring board on which a copper or other conductive pattern 13 is formed on a glass epoxy board or other insulating board 12; mounted on the circuit board 11 are various circuit elements (not shown) electrically connected via conductive pattern 13.

Similarly, circuit board 21 has an insulating board 22 and a conductive pattern 23. In the part where connector 41 is provided, is formed a hole 24 that goes through the front and back surfaces of the circuit board 21.

Connector 31 is a so-called "non-ZIF" connector in which the electrical connection and physical anchoring are ensured by pushing in the flexible wiring board with the prescribed force. Specifically, connector 31 has a case 32 which is made of plastic, etc., a contact part 33 which is provided inside case 32 and ensures the electrical continuity and physical anchoring of the flexible wiring board 51, and a terminal 34 which is electrically connected with contact part 33 and is provided on the outside of case 32 and is electrically connected with conductive pattern 13.

Formed in case 32 are an insertion opening 32A into which flexible wiring board 51 is inserted, and a sloping surface 32B for guiding the flexible wiring board 51 through the insertion opening.

Figure 2:
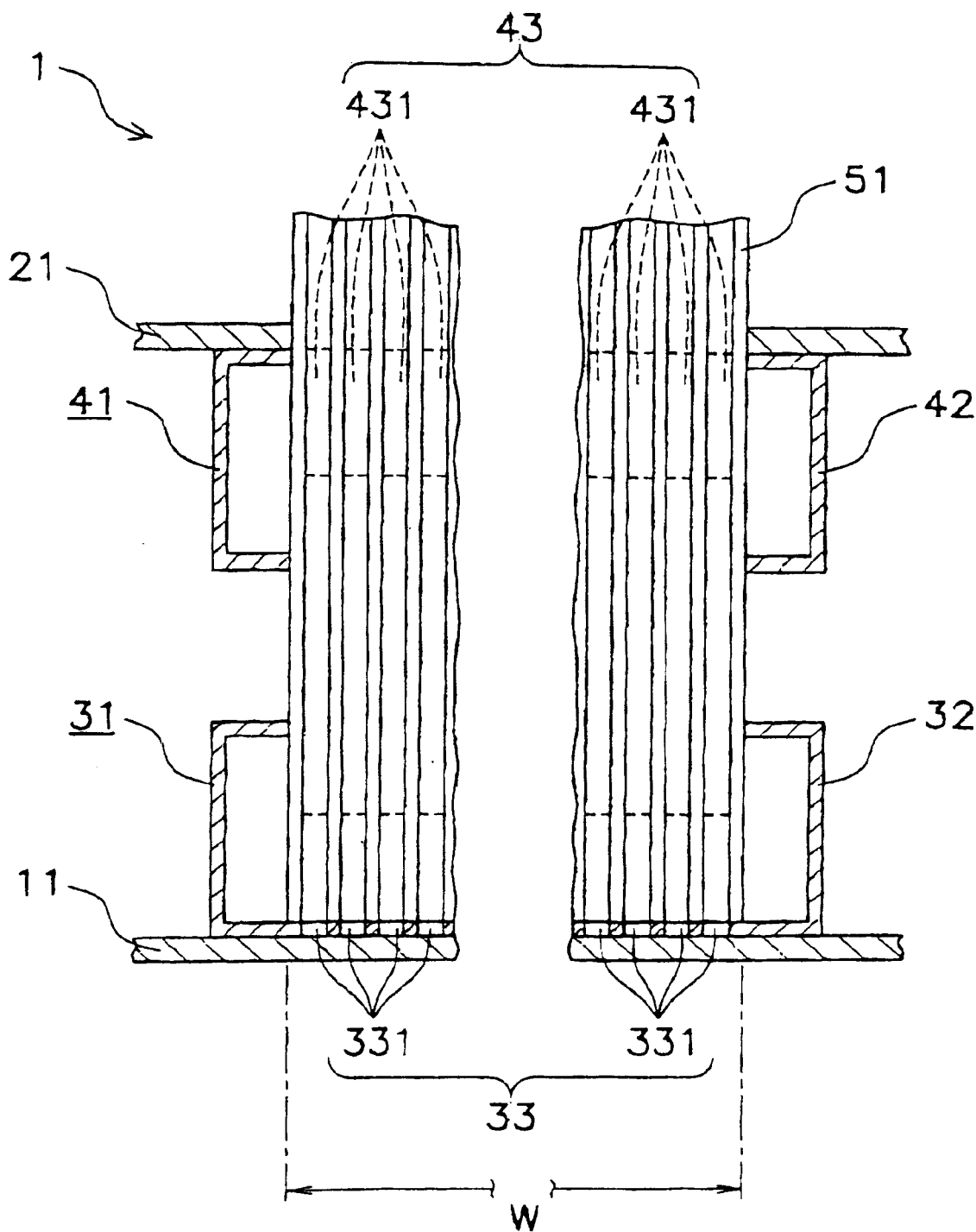
FIG. 2 is a cross-sectional view in the direction perpendicular to the cross-sectional view of FIG. 1.

As shown in FIG. 2, contact part 33 consists of multiple contact elements 331 arranged along the width direction of flexible wiring board 51. Contact elements 331 consist of spring-shaped members that impel the facing contact elements 331, and pinch and hold in place the flexible wiring board 51, which is inserted inbetween by the impelling force of these spring-shaped members. Formed on the contact elements 331 are insertion-side sloping surfaces 331 A for guiding flexible wiring board 51, and claws 331B for resisting the force of flexible wiring board 51 in the pullout direction.

As shown in FIGS. 1 and 2, connector 41 has the same structure as connector 31 in that it has a case 42, a contact part 43, and a terminal 44. Like contact part 33, the contact part 43 consists of multiple contact elements 431, and on contact elements 431 are formed insertion-side sloping surfaces 431A and claws 431B. The connector 41 is different from the connector 31 in that, besides insertion opening 42A and sloping surface 42B, formed in case 42, on the part facing insertion opening 42A is a pullout opening 42C through which the flexible wiring board 51 inserted through insertion opening 42A is pulled out.

Figure 3:
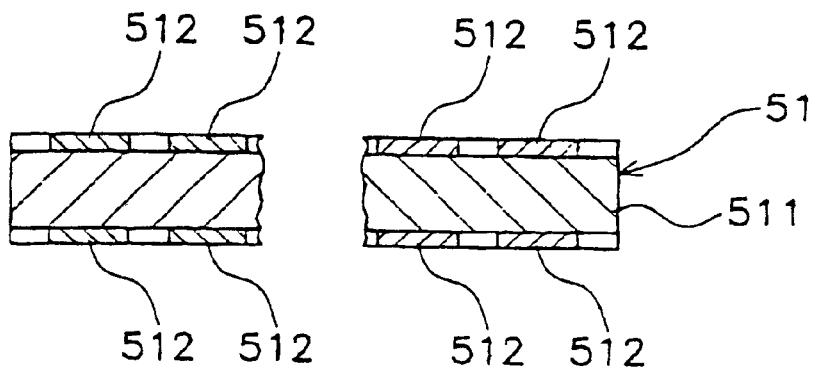
FIG. 3 is a cross-sectional view in a width direction of the structure of FIG. 1, showing the structure of the flexible wiring board.

Flexible wiring board 51 has, as shown in FIG. 2, a width dimension W that is roughly equal to insertion openings 32A, 42A of connectors 31, 41, and has, as shown in FIG. 3, a flexible base material 511 and multiple electrodes 512 formed on the front and back surfaces of the flexible board base material 511.

Board material 511 is made of PET or other flexible non-conductive material. Multiple electrodes 512 are formed along the extension direction of flexible wiring board 51 by etching or other pattern printing on board material 511.

Figure 4:
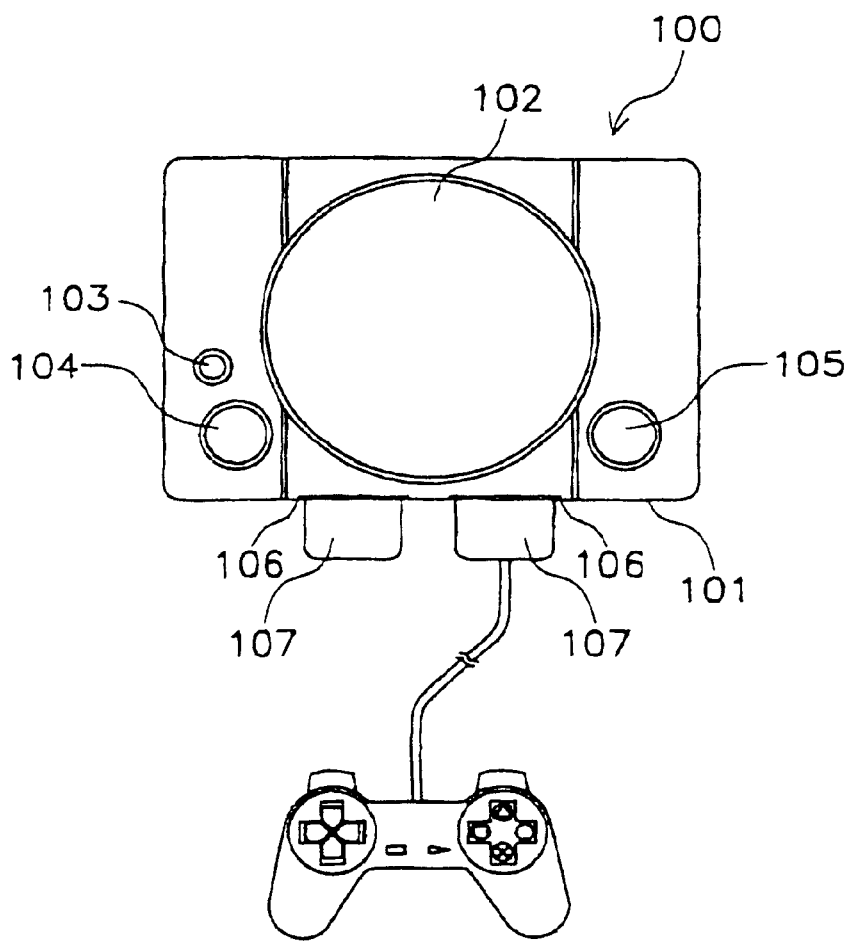
FIG. 4 is a plan view diagrammatically showing the structure of an electronic device that adopts the board connection structure of FIGS. 1–3.

The board connection structure 1 is adopted in a video game device 100 as shown in FIG. 4. The video game device 100, has a housing 101, a disk mounting unit 102, a reset switch 103, a power switch 104, a disk operation switch 105, and a card slot 106.

Housed inside housing 101 is the device main unit, which is constituted to include the circuit boards 11, 21, etc. An optical disk on which a video game or other application program is recorded, is mounted on disk mounting unit 102 provided on the top surface of housing 101, and the lid of disk mounting unit 102 is opened and closed by operating the disk operation switch 105.

Reset switch 103, power switch 104, and card slot 106 are electrically connected with circuit boards 11, 21. Reset switch 103 is a switch for arbitrarily interrupting and resetting an application program in progress. Power switch 104 is a switch for starting video game device 100. Card slot 106 is a part into which one inserts a RAM card 107 on which is recorded information on the game in progress, etc.

The following is the procedure for assembling video game device 100 having the board connection structure 1:

(1) Affix circuit board 11, with its surface on which connector 31 is mounted facing upward, into housing 101, insert flexible wiring board 51 into insertion opening 32A of connector 31, and ensure the electrical continuity and physical anchoring of flexible wiring board 51 and connector 31.

(2) Insert the tip end of flexible wiring board SI that is connected with connector 31 into insertion opening 42A of connector 41, and pull it out through the pullout opening 42C and hole 24 of circuit board 21.

(3) Adjust the distance between the two circuit boards 11, 21 in the range where the circuit elements on circuit boards 11, 21 do not come into contact with each other, correct the positional displacement of circuit boards 11, 21, then affix circuit board 21 to housing 11. If three or more circuit boards are to be laminated, affix circuit board 21 and a circuit board having the same kind of connector 41 and hole 24 to housing 101 by the same procedure as above.

The assembly procedure as described above has the following effects:

1. Because the pair of connectors 31, 41 are connected via flexible wiring board 51, any discrepancy in the mounting position of connectors 31, 41 on circuit boards 11, 21 can be absorbed by flexible wiring board 51, and circuit boards 11, 21 can be easily accommodated in housing 101.

2. By connecting circuit boards 11, 21 via flexible wiring board 51, the distance between the two circuit boards 11, 21 can be freely adjusted, thereby making it possible to improve the layout density of the parts of circuit boards 11, 21 etc. inside housing 101 and to reduce the size of the vide game device 100.

3. Through-type connector 41 is adopted for circuit board 21, and hole 24 is formed in circuit board 21 so as to match the pullout opening 42C of the through-type connector 41, thus making it possible to pull out the flexible wiring board 51 through the pullout opening 42C and hole 24. Therefore circuit boards 11, 21 can be connected without checking them from the side, which can greatly reduce the work of assembly during manufacturing of video game device 100.

4. Sloping surface 42B to guide flexible wiring board 51 is formed around insertion opening 42A of connector 41, thereby making it possible to quickly insert the flexible wiring board 51 into insertion opening 42A and further facilitating the operation of connecting circuit boards 11, 21.

5. Video game device 100 has various circuit boards for different applications, such as a main board, video board, and audio board, so that by adopting board connection structure 1 for each board connection, the efficiency of accommodating them within housing 101 can be improved, video game device 100 can be made smaller, and the operation of assembly can be greatly reduced.

Moreover, when connecting circuit boards 11, 21, flexible wiring board 51 may be inserted from outside of circuit board 21 in a state in which they first overlap without anchoring circuit boards 11, 21.

In this way, because it is possible to ensure the electrical connection of the two circuit boards 11, 21 by inserting flexible wiring board 51 after first securing circuit boards 11, 21 to housing 101, the assembly time of electronic devices can be further reduced.

Moreover, this invention is not limited to the above-described embodiment but also includes variations such as the following:

In the aforesaid embodiment, the pair of connectors 31, 41 are mounted on surfaces that face circuit boards 11, 21, but the invention is not limited to this. That is, the composition may be such that a through-type connector be mounted on the opposite side from the facing surface of the circuit board, a hole through which the flexible wiring board be inserted is formed in the circuit board, and when connection would be made, first the flexible wiring board would be inserted into that hole, then the flexible wiring board would be inserted into the insertion opening of the through-type connector.

Also, in the above embodiment, flexible wiring board 51 was inserted into connector 31, then the leading end of said flexible wiring board 51 was inserted into connector 41, but it is not limited to this. That is, the composition may be one in which the position of the pair of connectors be aligned, then the flexible wiring board would be inserted. In this case, it is difficult to pass the flexible wiring board through with an ordinary non-ZIF connector, so it is desirable to separately provide an anchoring structure by which the flexible wiring board is pinched and held fast by the connector into which the flexible wiring board is first inserted.

In addition, the structure and shape, etc. of the embodiment of this invention may have other structures, etc., provided that the purpose of this invention can be accomplished.

With this invention as described above, a pair of connectors on two circuit boards arranged in layers are connected via the flexible wiring board, which makes it possible to absorb by the flexible wiring board any discrepancy of mounting position of the connectors on the circuit boards, and to reduce the positional displacement of the two circuit boards and accommodate them in the housing of an electronic device, etc.

What is claimed is:

1. A board connection structure that electrically connects conductive parts of at least two circuit boards that are arranged in layers, comprising:

a pair of connectors configured so as to have electrical continuity with the conductive parts of said at least two circuit boards and arranged facing each other; and a flexible wiring board electrically connected with each of said pair of connectors and which ensures electrical continuity between said pair of connectors, wherein said flexible wiring board is inserted into both of said pair of connectors so as to ensure electrical connection and physical anchoring therebetween;

wherein at least one of said pair of connectors is a through-type connector which said flexible wiring board pierces when inserted, and on a circuit board surface on which said through-type connector is provided, holes are formed into which said flexible wiring board can be inserted from a surface opposite a mounting surface of said through-type connector.

2. The board connection structure as described in claim 1, wherein each of said connectors includes:

a case of non-conductive material in which an opening is formed into which the flexible wiring board is inserted, and a metal contact part that is provided inside said case to make contact with a conductive part formed on said flexible wiring board, said metal contact part having at least one claw that resists pulling-out force of said inserted flexible wiring board.

3. The board connection structure as described in claim 1, wherein said flexible wiring board is constituted of a flexible base material and has electrodes formed on one of a front surface and a back surface of the flexible base material.

4. An electronic device comprising a board connection structure that electrically connects conductive parts of at least two circuit boards arranged in layers wherein said board connection structure includes a pair of connectors configured to so as to have electrical continuity with the conductive parts of said at least two circuit boards and arranged facing each other; and a flexible wiring board electrically connected with each of said pair of connectors and which ensures electrical continuity between said pair of connectors, said flexible wiring board being inserted into both of said pair of connectors so as to ensure electrical connection and physical anchoring therebetween;

wherein at least one of said pair of connectors is a through-type connector which said flexible wiring board pierces when inserted, and on a circuit board surface on which said through-type connector is provided, holes are formed into which said flexible wiring board can be inserted from a surface opposite a mounting surface of said through-type connector.

5. The electronic device as described in claim 4, wherein each of said connectors includes:

a case of non-conductive material, in which an opening is formed into which the flexible wiring board is inserted, and a metal contact part that is provided inside said case to make contact with a conductive part formed on said flexible wiring board, said metal contact part having at least one claw that resists a pulling-out force of said inserted flexible wiring board.

6. The electronic device as described in claim 4, wherein, said flexible wiring board is constituted of a flexible base material and has electrodes formed on one of a front surface and a back surface of the flexible base material.

7. An electronic device comprising:

at least two circuit boards having rigidity;

a flexible wiring board; and connectors mounted facing each other respectively on said at least two circuit boards and electrically and mechanically connecting said flexible wiring board with said circuit boards, wherein said at least two circuit boards are connected to each other electrically by said flexible wiring board, thus increasing the degree of freedom concerning relative positions of said circuit boards and improving packability thereof into a cabinet of the electronic device;

wherein at least one of said pair of connectors is a through-type connector which said flexible wiring board pierces when inserted, and on a circuit board surface on which said through-type connector is provided, holes are formed into which said flexible wiring board can be inserted from a surface opposite a mounting surface of said through-type connector.

8. A electronic device according to claim 7, wherein an insertion opening is formed in each of said connectors, said flexible wiring board being inserted into said insertion opening and a sloping surface is formed around said insertion opening to guide insertion of said flexible wiring board into said connectors in assembling of the electronic device at the time of manufacture.

9. An electronic device according to claim 7, wherein said connectors are of non-ZIF type and electrically and mechanically connect said circuit boards and said flexible wiring board to each other.

10. An electronic device comprising;

multiple circuit boards having rigidity;

a flexible wiring board; and connectors that electrically and mechanically connect said flexible wiring board with said circuit boards, said connectors being respectively mounted on said multiple circuit boards, wherein holes are formed in said multiple circuit boards, which are aligned in position with said connectors for receiving said flexible wiring board therethrough, from a surface opposite a mounting surface of said through-type connector, and said multiple circuit boards are connected together electrically via said flexible wiring board,such that connectors mounted on at least two of said multiple circuit boards face each other.

11. An electronic device comprising:

a flexible wiring board;

multiple through-type connectors that are connected electrically and mechanically with said flexible wiring board; and multiple circuit boards that each mount one of said multiple through-type connectors and in which through-holes are formed aligned in position on said connectors for receiving said flexible wiring board therethrough, from a surface opposite a mounting surface of said through-type connector, and wherein said multiple circuit boards are combined in layers with respect to said flexible wiring board using said through-holes, such that connectors mounted on at least two of said multiple circuit boards face each other.

* * * * *

UNITED STATES PATENT AND TRADEMARK OFFICE
CERTIFICATE OF CORRECTION

PATENT NO. : 6,477,059 B1
DATED : November 5, 2002
INVENTOR(S) : A. Ono et al.

It is certified that error appears in the above-identified patent and that said Letters Patent is hereby corrected as shown below:

Title page,
Item [30], please add the Foreign Application Priority Data to read:
-- AUGUST 27, 1999 (JP) P11-241880 --

Signed and Sealed this

Eighteenth Day of February, 2003

JAMES E. ROGAN
*Director of the United States Patent and Trademark Office*